(12) United States Patent
Hannah et al.

(10) Patent No.: US 6,639,832 B2
(45) Date of Patent: Oct. 28, 2003

(54) QUANTUM MAGNETIC MEMORY

(75) Inventors: Eric C. Hannah, Pebble Beach, CA (US); Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 09/925,245

(22) Filed: Aug. 8, 2001

(65) Prior Publication Data

US 2003/0031041 A1 Feb. 13, 2003

(51) Int. Cl.[7] ............................................. G11C 11/14
(52) U.S. Cl. .................... 365/171; 365/173; 365/174
(58) Field of Search .............................. 365/171, 173, 365/174

(56) References Cited

U.S. PATENT DOCUMENTS

| | | | |
|---|---|---|---|
| 4,388,131 A | * 6/1983 | Unger et al. ............. | 156/89.12 |
| 5,194,881 A | 3/1993 | Hirt | |
| 5,546,337 A | 8/1996 | Hurt et al. | |
| 5,639,547 A | * 6/1997 | Mitsuoka et al. ........... | 428/332 |
| 5,940,314 A | 8/1999 | Suzuki et al. | |
| 6,061,265 A | 5/2000 | Hannah | |
| 6,388,912 B1 | * 5/2002 | Hannah et al. ............. | 365/121 |
| 6,480,412 B1 | * 11/2002 | Bessho et al. .............. | 365/173 |

FOREIGN PATENT DOCUMENTS

JP 2000100154 A * 4/2000 ........... G11C/11/15

* cited by examiner

*Primary Examiner*—Van Thu Nguyen
(74) *Attorney, Agent, or Firm*—Steven P. Skabrat (57) ABSTRACT

A system for writing data to and reading data from a magnetic medium utilizing a spin polarized electron beam. One embodiment of the disclosed subject matter may include an array of magnetic locations, each magnetic location including a hard magnetic material sandwiched in between a first and a second layer of a spin-mirror material and a layer of semi-conductor material.

6 Claims, 6 Drawing Sheets

QUANTUM MAGNETIC MEMORY

BACKGROUND

1. Field

The present disclosure relates to memory systems and in particular to systems and methods for writing data to and reading data from magnetic memory systems using spin-polarized electron beams.

2. Background Information

The predominant mass storage device in conventional computer system is the hard disk drive. Hard disk drives are relatively large, electromechanical devices that can store a relatively large amount of data. The stored data is accessed through a read/write head that rides on a cushion of air above the rapidly rotating disk. The read/write head moves radially to access data in different tracks of the rotating disk. Data transfer is limited by the speed at which the disc rotates and the speed with which the read/write head is positioned over the required track. Even with the fastest devices, access times are on the order of thousands of microseconds, due to the relatively large mechanical motions and inertia involved. This time scale is at least five orders of magnitude slower than the nanosecond time scales at which processors operate. The discrepancy can leave the processor starved for data.

One proposed data storage system that may provide both higher data densities and faster access times than currently available mass storage devices employs spin-polarized electrons to read data from and write data to a storage medium. Electron beams can be manipulated by charged-particle optics, which operate on time scales closer to those seen in processors. U.S. Pat. Nos. 5,546,337 and 5,604,706 describe systems that employ spin-polarized electrons to transfer data to and from a storage medium. The disclosed systems scatter spin-polarized electron beams from the magnetic moments associated with different storage locations on the medium to read data from and, arguably, to write data to these locations.

One problem with the above system is that the characteristics of the storage media that provide desirable magnetic properties also make it difficult to alter these magnetic properties, i.e. to write data, using electron beams. A typical storage medium includes a relatively thin layer of a magnetic material, such as iron (Fe), deposited on a layer of a conductive, non-magnetic material. This combination of material layers creates a quantum well. Using a thin layer of magnetic material forces the easy axis of magnetization out of the plane of the magnetic layer. The resulting perpendicular magnetization supports denser packing of the magnetic domains that represent individual data bits, e.g. the storage locations.

The thin magnetic layer of a storage location is illuminated with a spin-polarized electron beam emitted from a source located as close as a few millimeters above the storage medium. The source-to-medium separation provides time and space to steer the beam to the targeted storage location. However, this geometry also delivers the beam electrons to the magnetic layer at normal or near normal angles of incidence, i.e. perpendicular to the thinnest dimension of the magnetic layer. The volume of the magnetic layer sampled by the electron beam ("interaction volume") is thus relatively small, and the number of electrons in the magnetic layer ("target electrons") to which the beam electrons couple is similarly small.

An additional problem is that electron beam sources produce electron energies of several tens of electron volts (eV). At these energies, the probability of an incident electron being bound by the quantum well formed by the magnetic layer is greatly reduced. The combination of the thin layer of magnetic material, the normally incident beam, and the high electron energy thus limits the strength of the coupling between the spin-polarized electron beam and the target electrons.

In order to flip the spin state associated with a storage location, the relative number of spin up and spin down electrons must be reversed before spin-relaxation mechanisms restore the status quo. In ferromagnetic materials, exchange interactions among the electrons make the dominant spin state more stable than the minority spin state. If a relatively small portion of the dominant spin electrons interact with the spin-polarized electron beam, any spin flipping triggered by the beam will be ameliorated by spin-relaxation mechanisms.

Effective spin flipping thus requires the incident beam of spin-polarized electrons to interact with a large number of electrons in the magnetic material (target electrons) over a relatively short time. The electron beam must effect a critical number of target electrons within a spin-relaxation time, or else the dominant spin state will reestablish itself.

Systems have been developed that allow the coupling between spin-polarized electrons and the target electrons in the magnetic material to reverse the majority spin state. For example, scanning tunneling microscopes (STMs) employ scanning tips that are positioned within a few Angstroms (Å) of the surface of the magnetic layer. The scanning tip may be modified to cause spin-polarized electrons to tunnel from the tip into the medium. STMs may emit electrons into the target material with energies substantially below 1 eV. As a result, the spin-polarized electrons tend to become trapped by the quantum well formed by the magnetic layer and move laterally along the layer, allowing each incident electron to couple to many target electrons before it exits the magnetic material. STM's can provide very high spin-polarized current densities, e.g. several micro amps per square nanometer. The combination of quantum well trapping and very high current density has been demonstrated to reverse the magnetic sense of a thin magnetic film.

The STM geometry and physical translation mechanism are not suitable for high performance storage media applications. For example, the close proximity of the scanning tip to the surface limits the area of the storage medium that may be scanned by deflecting the electron beam. In addition, STM scanning techniques translate the entire STM apparatus relative to the medium, making them too slow for processor applications.

The present disclosed subject matter addresses these and other problems associated with writing to and reading data from magnetic media using spin-polarized electron beams.

BRIEF DESCRIPTION OF THE DRAWINGS

The present disclosed subject matter may be understood with reference to the following drawings, in which like elements are indicated by like numbers. These drawings are provided to illustrate selected embodiments of the disclosed subject matter and are not intended to limit the scope of the invention.

DETAILED DESCRIPTION

In the following detailed description, numerous details are set forth in order to provide a thorough understanding of the present claimed subject matter. However, it will be understood by those skilled in the art that the claimed subject matter may be practiced without these specific details. In other instances, well-known methods, procedures, components, and circuits have not been described in detail so as to not obscure the claimed subject matter.

The present invention provides a system for reading data from and writing data to a storage medium, using a beam of spin-polarized electrons. A system in accordance with the claimed subject matter employs a storage medium that promotes enhanced coupling between the spin-polarized electrons of the beam ("beam electrons") and the electrons of a magnetic layer in the storage medium ("target electrons"). Beam electrons of a particular spin polarization are preferentially trapped in a volume that includes the magnetic layer, allowing each beam electron to undergo energy transferring collisions with multiple target electrons having the opposite spin polarization.

The spin polarization of the beam electrons that are preferentially trapped is determined by the majority spin state of the electrons of the magnetic material at the target location (target electrons). This majority spin state determines the magnetic state of the location. The electron beam has a net polarization that is determined by the majority spin state of its component electrons (beam electrons). The magnetic state of a location may be flipped by illuminating the location with an electron beam having a net polarization (majority spin state) that is opposite to the majority spin state of the target electrons.

A storage medium in accordance with the claimed subject matter includes a spin-dependent electron trap and a layer of semi-conductor material to facilitate the emission of photons. The claimed subject matter may be better understood by explaining the benefits of a spin-dependent electron trap, which are discussed in further detail in U.S. patent application Ser. No. 09/539,722, entitled "Quantum Magnetic Memory."

A particular embodiment of the spin-dependent electron trap may be a layer of a hard magnetic material is sandwiched between first and second layers of spin-mirror materials. In this context, the term "layer" refers to one or more atomic layers, the actual number and composition of which may be varied to tune the properties of the spin-dependent electron trap.

The spin-mirror material is a magnetically polarizable material that is characterized by a relatively low density of electron states at its Fermi level for electrons in a first spin state and a relatively high density of states for electrons in a second, opposite spin state. This electronic structure increases the probability that an electron in the first spin state incident on the spin-mirror material will be reflected rather than transmitted through the spin-mirror material. In effect, the spin-mirror material provides spin-dependent transmission/reflection for electrons in a range of incident energies. While materials with greater than zero densities of states may be used for the present invention, they will not be as effective as those having zero densities of state, since the available states allow some leakage.

Electrons in the second spin state may be captured between the spin-mirror materials by injecting them into the spin-dependent electron trap at relatively high incident energies, i.e. energies above the Fermi level. Collisions between the incident electron and the electrons of the storage medium reduce the incident electron's kinetic energy to a range in which the spin-dependent transmission properties of the spin-mirror material become apparent. Providing magnetic material between the two layers of spin-mirror material allows each trapped electron to interact with many target electrons, as the beam electron is reflected between the two spin mirror layers. The resulting coupling facilitates flipping of the spin state of the magnetic material.

In an embodiment of a spin-dependent trap, the spin-mirror material may be a half metal. A typical half metal is a ferromagnetic material in which ferromagnetic decoupling shifts the energy levels for one spin state relative to those for the opposite spin state to provide the above described electronic structure. A half metal acts as an insulator to electrons in one spin state and a conductor to electrons in the other spin state.

For another embodiment of a spin-dependent trap, the magnetic material is a hard magnetic material and the spin-mirror material is a soft magnetic material. In this context, the terms hard and soft magnetic materials represent materials having larger and smaller coercivities, respectively. Generally, soft magnetic materials have fewer minority spin electrons in the vicinity of the Fermi level. Strain induced in these materials under appropriate deposition conditions may perturb the electronic structure of these soft materials sufficiently to provide to convert them into half-metallic materials or near half-metallic materials.

The increased coupling provided by the spin-dependent trap allows the beam electrons in a specified spin state to transfer energy to a greater number of target electrons. The Pauli exclusion principle ensures that this energy is transferred preferentially to target electrons that have spin alignments opposite to the majority spin state of the beam electrons ("opposite spin electrons") over those that have the same spin alignments as the beam electrons ("same spin electrons"). The resulting spin-dependent energy transfer to the target electrons enhances the probability of preferential spin flipping, as discussed in greater detail below.

Figure 1A:
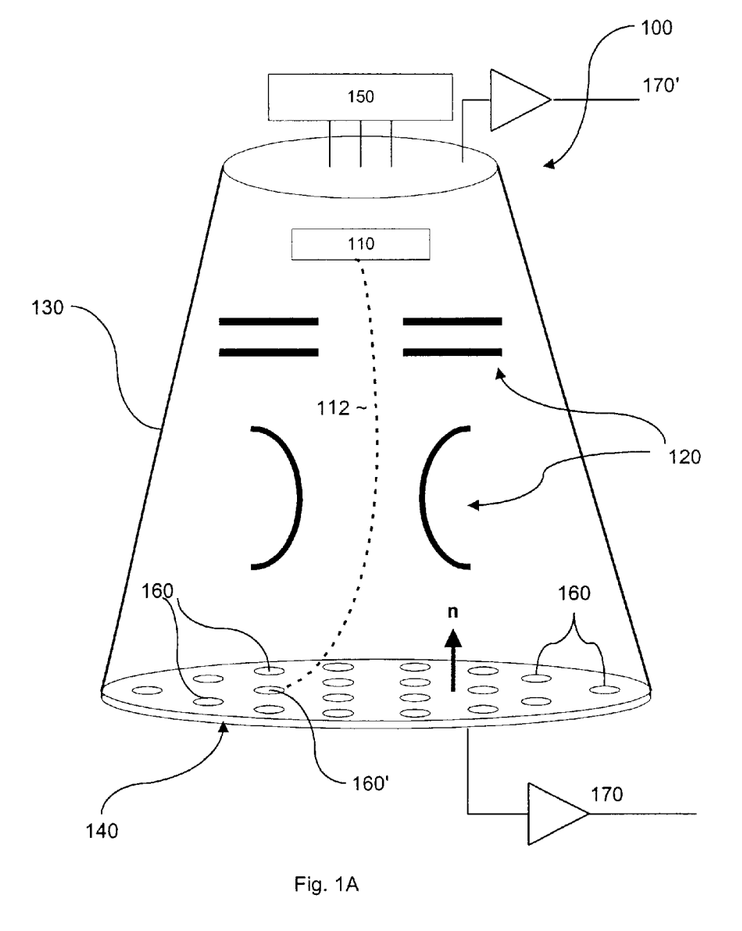
FIG. 1A is a schematic representation of a system for reading and writing magnetic media using a spin-polarized electron beam.

FIG. 1A is a schematic representation of a system 100 for reading and writing magnetic media 110 using a beam 112 of spin-polarized electrons. System 100 includes a source 110, an electron optic system 120, a vacuum housing 130, a storage medium 140 and a control module 150 for electron optics 120. Source 110 generates spin-polarized electrons, which are directed to selected storage locations 160 on storage medium 140, using electron optics 120. Suitable sources include, for example, electron beam micro-columns. Each location 160 on storage medium 140 may represent a data bit. In FIG. 1A, electron beam 112 is shown directed to read or write data at location 160'.

Each storage location 160 typically includes a magnetic material that may be magnetized in one of two orientations to represent a data bit in a high or low logic state. In this context, storage location 160 may be referred to as a "magnetic bit." The two alignments of the magnetization are generally referred to as "spin-up" and "spin-down," but the actual direction of alignment depends on the structure of the storage medium. For high-density storage devices, the preferred alignments are parallel and anti-parallel to a surface normal vector (n).

Figure 1B:
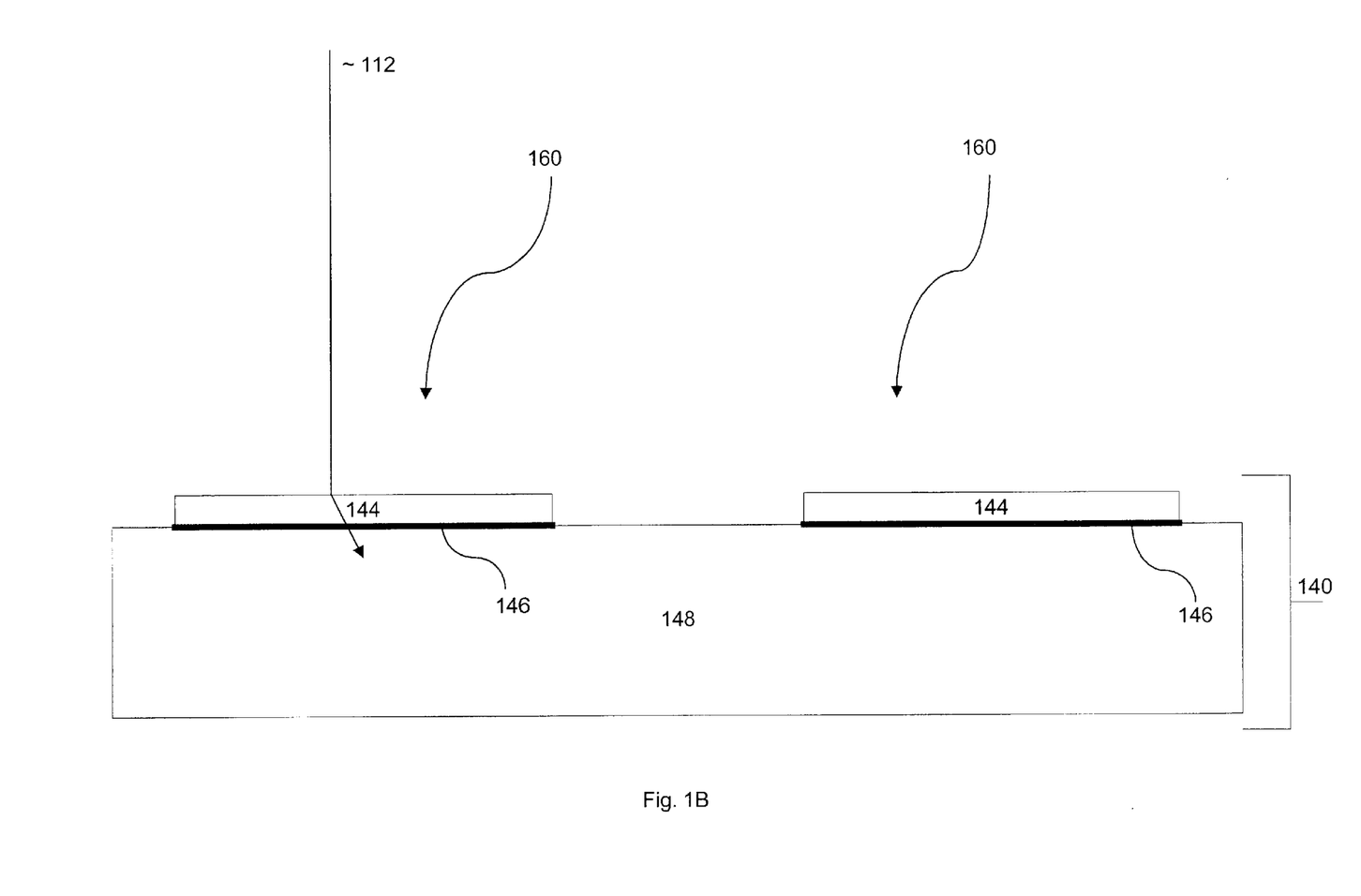
FIG. 1B is a block diagram of a conventional magnetic recording medium for use with the system of FIG. 1A.

FIG. 1B is a block diagram of an embodiment of a conventional storage medium 140 designed to provide magnetizations parallel or anti-parallel to surface normal n. Storage medium 140 includes a relatively thin layer of magnetic material 144 deposited on a conductive, non-magnetic material 148. The different crystal structures of magnetic material 144 and non-magnetic material 148 meet at a boundary 146. Strain between the different crystal structures at boundary 146 forces the easy axis of magnetization out of the plane magnetic layer 144. In addition, the discontinuity at interlayer boundary 146 creates a barrier that limits charge flow between the materials. Non-magnetic layer 148 is coupled to a sense amplifier, which may be used to "read" the logic state of a location 160 as it is illuminated with a spin-polarized electron beam 112. The sense amplifier detects the amount of current that passes through the magnetic layer rather than being reflected from the metallic layers. Spin-polarized electron beam 112 reads the logic state stored at one of locations 160 by taking advantage of the dependence of beam scattering behavior on the relative orientation of the beam and target electron spin polarizations.

Figure 2:
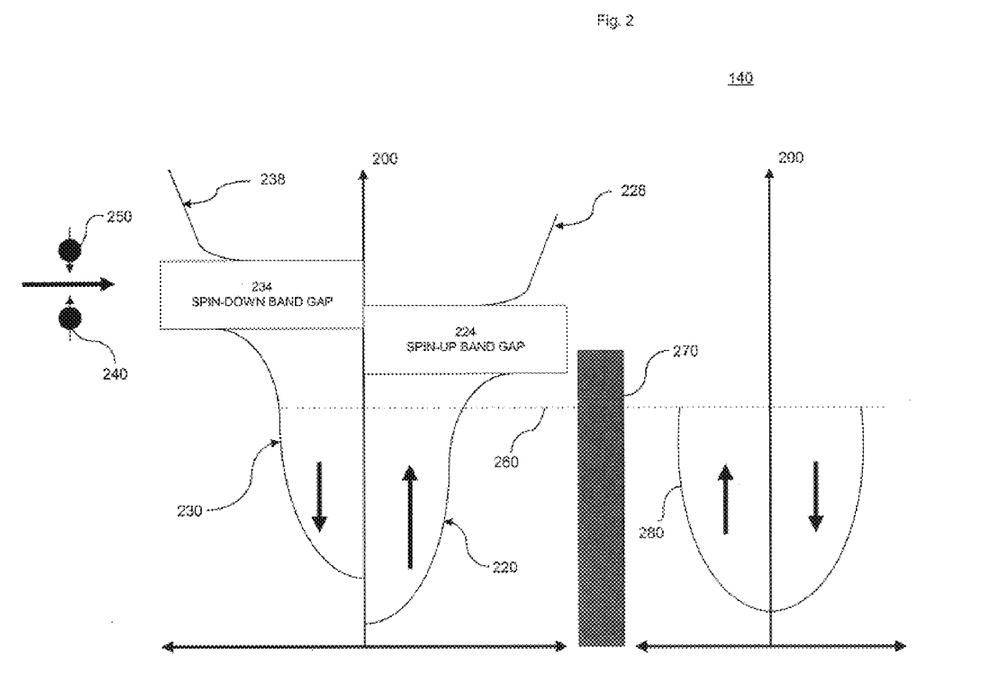
FIG. 2 is a simplified band model illustrating the spin-dependent transmission properties of ferromagnetic materials.

FIG. 2 is a simplified model of the electron energy levels (bands) present in storage medium 140. FIG. 2 includes a simplified band model representation of a ferromagnetic material 200 that is suitable for magnetic layer 144 (see FIG. 1B). A tunneling barrier 270 associated with interlayer boundary 146 (see FIG. 1B), and a conduction band 280 for non-magnetic, conductive material 148 (see FIG. 1B) are also shown.

As is well known, the populations of spin up and spin down electrons are different in ferromagnetic materials. The net magnetization of the magnetic material is determined by which spin state is more populated. An exchange interaction stabilizes electrons in the predominant (majority) spin population and tends to maintain the net magnetization of the material. Changing this net magnetization requires flipping a sufficient number of electron spins to reverse the predominant spin state.

The band model of FIG. 2 represents the allowed energy levels for electrons in ferromagnetic material 200 (vertical axis), as a function of wavenumber, k (horizontal axis). Separate bands 220, 228 and 230, 238 are indicated for spin-up and spin-down electrons, respectively. The vertical offset between bands 220, 228 and 230, 238 indicates the energy difference between the two spin alignment states. Ferromagnetic material 200 has a net magnetization in the spin-up state, because there are more spin up electrons than spin down electrons.

A Fermi level 260 is shown in FIG. 2 to indicate the highest energy level occupied by the electrons of material 200. For transition metals, the conduction band is derived from the partially filled d-orbitals of the component metals atoms, and Fermi level 240 lies within the conduction band, as indicated. The actual band structure for transition metals is more complex than that indicated in FIG. 2, but the simple model suffices for the purpose of this discussion.

A spin-up band gap 224 represents a band of energies between conduction band 220 and another band 228 of allowed energies, from which spin up electrons are excluded. That is, spin up electrons in magnetic material 200 may have energies that fall above or below band gap 224, but they may not have energies that fall within band gap 224. Similarly, spin-down band gap 234 represents a band of energies between conduction band 232 and another energy band 238 from which spin down electrons are excluded. Band model representations of magnetic materials are discussed, for example, in Kittel, "Introduction to Solid State Physics," John Wiley & Sons, New York (1996).

Also shown in FIG. 2 are a spin up electron 240 and a spin down electron 250. The energy with which electrons 240, 250 are incident upon magnetic material 200 is indicated by their position along the vertical energy axis. Spin down electron 250 is incident on magnetic material 200 at an energy that corresponds to band gap 234 for spin down electrons in magnetic material 200. Consequently, spin down electron 250 will be scattered from magnetic material 200 with high probability. On the other hand, this same incident energy places spin up electron 240 at an energy level corresponding to allowed energy band 228, where spin up electron 240 may move freely through magnetic material 200. If magnetic material 200 is deposited on a conductive non-magnetic material, i.e. layer 148, spin up electron 240 may tunnel into layer 148.

To write a specific logic state to a target location, the electron optics illuminate the location with a spin-polarized electron beam 112 having properties designed to flip the dominant spin, if necessary, to the appropriate spin state. For example, if spin up represents a first logic state and a second logic state is to be written to the location, the location is illuminated with a spin-polarized electron beam 112 aligned to flip the dominant spin. One factor that determine whether or not the spin state of the location flips is the strength of the coupling between the spin-polarized beam electrons and the target electrons of the dominant spin state of material 200. In particular, the beam electrons should interact with a relatively large portion of the spin up electron population in the magnetic material. Other factors that may contribute to spin flipping include the spin-relaxation time of the material, the spin-dependent tunneling current out of the magnetic material for given target electron energies, and the spin-independent current into the magnetic material.

Figure 3:
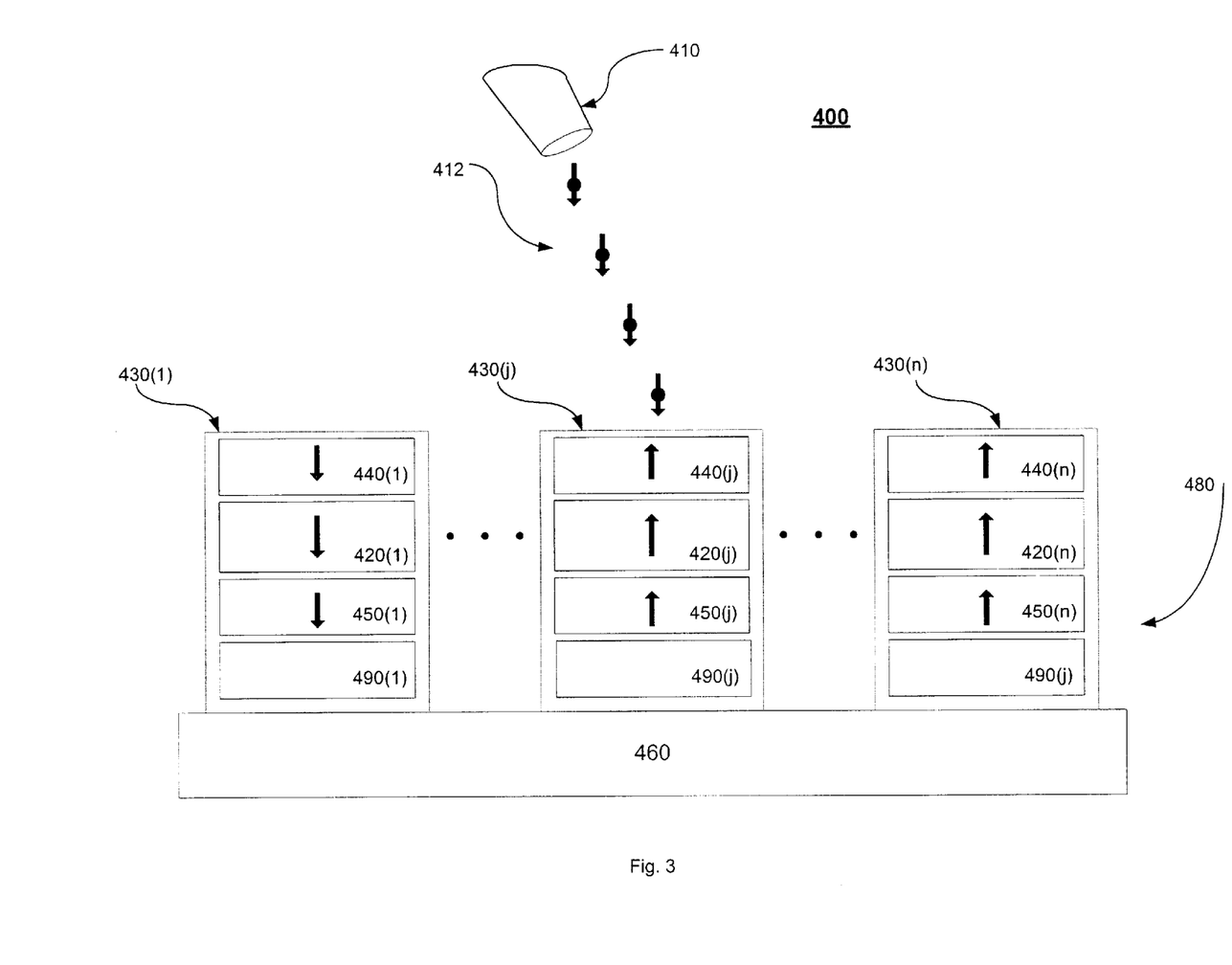
FIG. 3 is a schematic representation of one embodiment of a system including a spin-dependent electron trap and a layer of semi-conductor material in accordance with the claimed subject matter.

FIG. 3 is a schematic representation of one embodiment of a storage system 400 in accordance with the claimed subject matter. Storage system 400 includes an electron source 410 and a storage medium 480. Electron source 410 provides a beam of spin polarized electrons 412 to a specified location on storage medium 480. Storage medium 480 is represented as an array of spin-dependent electron traps 430(1)–430(n) (generically, "electron trap 430") and semiconductor layers 490(1)–490(n) (generally, "semi-conductor layer 490"). While actual systems employ two-dimensional arrays of electron traps 430 and semi-conductor layers 490 as in FIG. 1, a one-dimensional array is shown for purposes of illustration.

Each spin-dependent electron trap 430 comprises a magnetic material 420 sandwiched between first and second spin mirrors 440, 450. In the following discussion, "spin mirror" refers to a magnetically-polarizable material that, for a range of energies, preferentially reflects electrons in one spin state, while transmitting those in the opposite spin state. In one embodiment, such a spin mirror material may include, for example, NiMnSb or PtMnSb. In one embodiment, such a magnetic material may include, for example, iron (Fe). However, one skilled in the art will realize that other materials may be used. In the absence of an externally applied force, the spin-state of the mirrors self aligns to the current spin-state of the magnetic material between them. The energies at which this spin-dependent transmission is most pronounced are typically near the Fermi level of electron trap 430, where the incident electron samples the quantum well structure of the electron trap. At energies significantly above the Fermi level, e.g. several electron volts (eV), energy bands are available to transmit electrons in both spin states.

The magnetically-polarizable character of spin mirrors 440, 450 is indicated by the alignment of their spin states with that of the magnetic material 420. The spin-differentiated transmission of a spin mirror may be controlled through the composition of the material or it may be induced by straining a material that does not otherwise exhibit spin-differential transmission. Spin mirrors 440 and 450 act as spin-dependent mirrors to trap beam electrons 412 having a given spin state within electron trap 430. Trapped beam electrons in the specified spin state have ample opportunity to couple strongly to target electrons in the opposite spin state, as the trapped electrons repeatedly scatter in the magnetic material 420 between layers 440 and 450.

For the disclosed embodiment of storage medium 480, electron trap 430 is shown deposited on a conductive, semi-conductor layer 490. This semi-conductor layer is deposited on a conductive, non-magnetic layer 460. As discussed below, semi-conductor layer 490 and non-magnetic layer 460 provides a pathway for electrons that are excited by collisions with the beam electrons to move away from electron trap 430.

Figure 4:
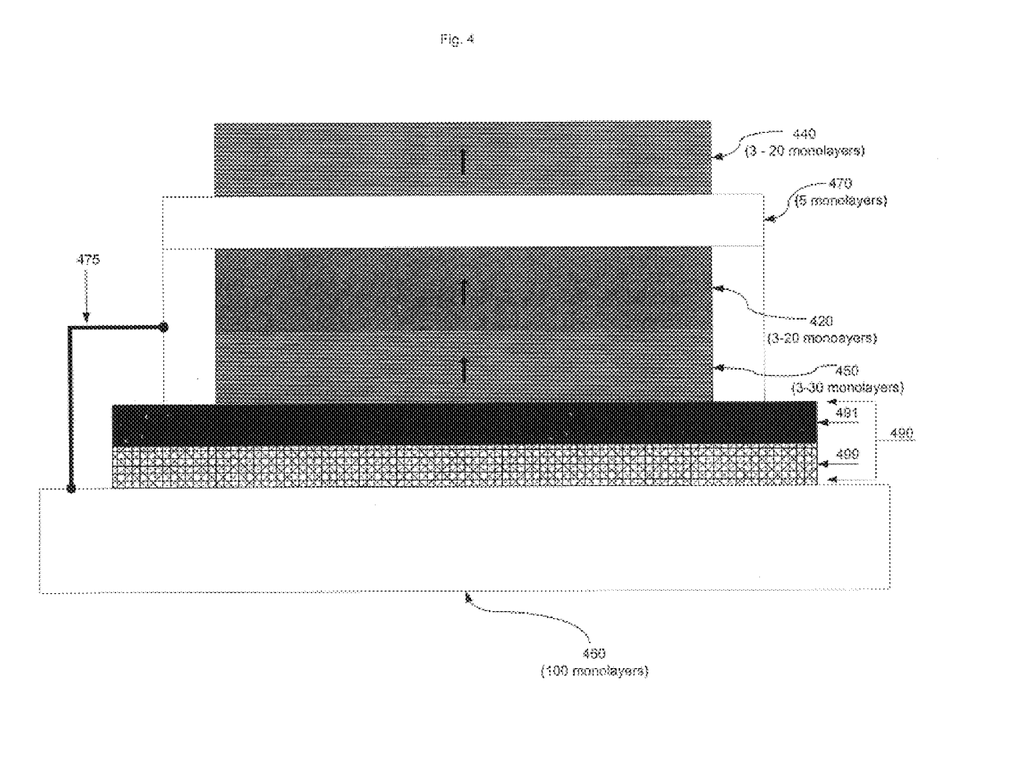
FIG. 4 is a more detailed diagram of one embodiment of the spin-dependent electron trap and layer of semi-conductor material of FIG. 3.

FIG. 4 is a block level diagram showing one embodiment of electron trap 430 and semi-conductor layer 490 in greater detail. The embodiment of electron trap 430 includes a second layer of non-magnetic material 470 between spin mirror 440 and magnetic material 420. The second layer of non-magnetic material 470 is in electrical contact, via connection 475, with the semi-conductor layer 490 to provide an efficient pathway for excited electrons to reach non-magnetic material 460.

In one embodiment, the semi-conductor layer 490 may include an N-type semi-conductor layer 491 deposited above a P-type semi-conductor layer 499, in order to form a P-N junction. In the embodiment illustrated in FIG. 4, semi-conductor layer 490 may be fabricated from electron-excited light emitting structures, so that photons may be generated when electrons move away from electron trap 430. As electrons move away from electron trap 430, as described above, they may flow through the semi-conductor layer 490 and into the conductive, non-magnetic layer 460. Once spin-polarized electrons have transited through the various magnetic layers, they become injected majority carriers in the N-type semi-conductor layer. These electrons may then recombine with holes, in the P-type semi-conductor layer, and emit photons. Any remaining electrons may then transit into the conductive, non-magnetic layer 460.

Therefore, the spin alignment of an electron trap 430 may be "read" by illuminating it with a spin-polarized electron beam 412 and measuring the photons, or lack thereof, emitted by semi-conductor layer 490. In the system of FIG. 1A, for example, the luminance may be measured using photo-detector 170 or, in an additional embodiment, photo-detector 170'. It is thus a relatively simple process to read the spin state of a location 160 (FIG. 1A), which includes an electron trap 430.

In one embodiment, the semi-conductor layer 490 may be fabricated from a direct-band semiconductor, such as, for example, semiconductors including Gallium-Arsenic (GaAs) or other III–V elements. However, one skilled in the art will realize that other materials may be used. Direct-band semi-conductors may be desirable so that the recombination of holes and electrons, in the semi-conductor layer, may be as efficient as possible. For example, utilizing a direct-band semi-conductor, the creation of photons would not the emission of phonons (a quantum of acoustic or vibrational energy) in order to satisfy the law of conservation of momentum.

An embodiment may include sandwiching a very thin, conductive interlayer between the semi-conductor 490 and the magnetic layer 450 to perform lattice matching between the P-N junction. In an additional embodiment, the conductive, non-magnetic layer 460 is chosen so as to facilitate the reflection of photons emitted by the P-N junction.

In one embodiment, the conductive, non-magnetic layer 460 may be sufficiently thin or transparent to the wavelength of photons emitted by the semi-conductor layer 490 to facilitate the detection of the photons from the "backside" or below the structure. It is known that photons may penetrate in excess of a micron of metal conductor thickness. It is also known that that materials may be made which are transparent, or sufficiently opaque, to a desired wavelength of light. In this embodiment, a photo-detector, such, as for example, detector 170 (FIG. 1A), may be used to capture and detect the emitted photons. However, one skilled in the art will realize that other methods of detection may be used.

Also indicated in FIG. 4 are exemplary thicknesses for the different layers of material. For example, spin mirrors 440, 450 may include between 3 and 20 monolayers of a half metallic material. The thicker structures may be used to slow down the incident beam electrons through beam-target collisions. Magnetic material may include 3 to 20 monolayers of a hard magnetic material, depending on the desired direction of magnetic polarization among other things. Non-magnetic materials 450 and 470 may include approximately 100 monolayers and approximately 5 monolayers, respectively, of a nonmagnetic material. However, one skilled in the art will realize that the thicknesses of these layers may be adjusted to tune the properties of electron trap 430, as discussed below in greater detail.

The number of atomic layers (or monolayers) of magnetic material 420 and spin mirrors 440, 450 may be selected to tune the magnetization properties of electron trap 430. For example, when magnetic material 420 is iron (Fe), a thickness of two to four atomic layers may be epitaxially deposited on, e.g. spin mirror 450. Mismatches between the lattice constants of magnetic material 420 and spin mirror 450 create strain in magnetic material 420, which rotates its easy axis of magnetization out of the plane formed by the layer of magnetic material 420.

The thicknesses of the spin mirrors 440, 450 and the non-magnetic material 470 may also be adjusted to enhance trapping of beam electrons. The absence of spin-dependent reflection for high incident energies allows beam electrons in the spin state that is reflected at lower energies to penetrate electron trap 430. These electrons can subsequently lose energy through collisions with electrons of spin mirrors 440, 450 and magnetic material 420 ("target electrons"). The thicknesses of spin mirrors 440, 450 and/or magnetic material 420 may be adjusted to increase the likelihood that beam electrons undergo enough collisions to reduce their energies to levels at which they can become trapped by spin mirrors 440, 450.

In addition, the thicknesses of the spin mirrors 440, 450 and non-magnetic material 470 may also be adjusted to facilitate the detection of the photons from the "frontside" or above the top spin mirror layer 440. It is known that photons may penetrate upwards of a micron of metal conductor thickness and that materials may be made which are transparent, or sufficiently opaque, to a desired wavelength of light. In this embodiment, a photo-detector, such, as for example, detector 170' (FIG. 1A), may be used to capture and detect the emitted photons. In addition, the reflectivity of nonmagnetic layer 460 may be adjusted to facilitate the detection of the photons from the "frontside." Also, the inside of vacuum housing 130 (FIG. 1A) may be made reflective. This may be done to form an integrating sphere for the emitted photons. However, one skilled in the art will realize that other methods of detection may be used.

Figure 5:
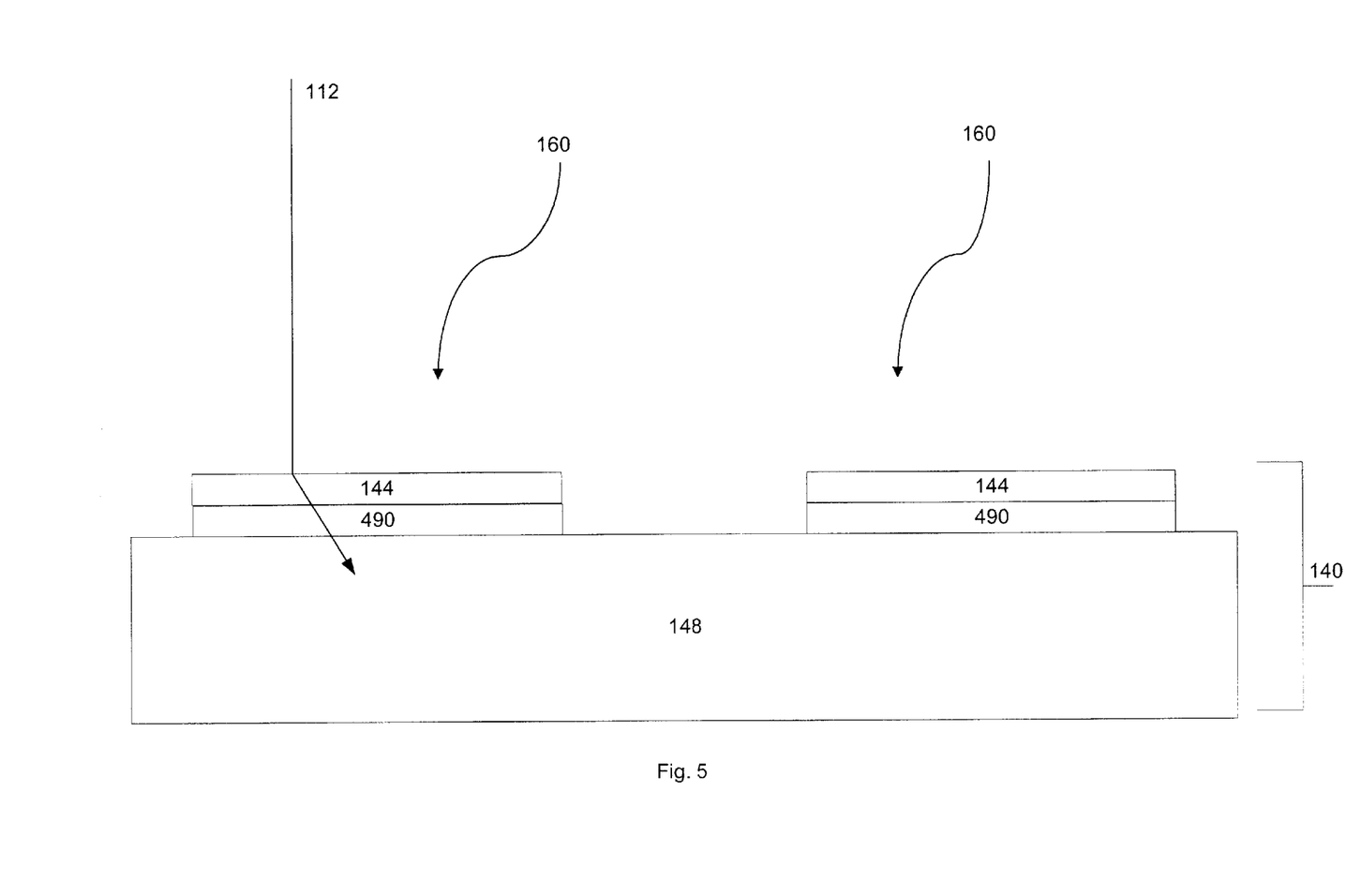
FIG. 5 is a block diagram of one embodiment of the magnetic material and a layer of semi-conductor material.

FIG. 5 illustrates an alternate embodiment of the claimed subject matter. As in FIG. 1B, a conventional storage medium 140 includes a relatively thin layer of magnetic material 144 deposited above a conductive, non-magnetic material 148. In this embodiment a layer of semi-conductor material 490 is sandwiched between the magnetic layer 144 and the non-magnetic layer 148. Spin-polarized electrons, from spin-polarized electron beam 112, may be differentially transmitted into the semi-conductor layer 490. The semi-conductor layer 490 may include a P-N junction that emits photons when excited by electrons. One skilled in the art will understand that these photons may be detected in a variety of ways.

While certain features of the claimed subject matter have been illustrated and described herein, many modifications, substitutions, changes, and equivalents will now occur to those skilled in the art. It is, therefore, to be understood that the appended claims are intended to cover all such modifications and changes that fall within the true spirit of the claimed subject matter.

What is claimed is:

1. A storage structure comprising:
    an array of magnetic locations, each magnetic location including a hard magnetic material sandwiched between a first and second layer of a spin-mirror material and a layer of semi-conductor material; and
    wherein the layer of semi-conductor material includes a P-N junction.

2. The storage structure of claim 1, wherein the P-N junction comprises an electron excited light emitting structure.

3. A storage structure comprising:
    an array of magnetic locations, each magnetic location including a hard magnetic material sandwiched between a first and second layer of a spin-mirror material and a layer of semi-conductor material; and
    wherein the layer of semi-conductor material includes a direct-band semiconductor.

4. The storage structure of claim 3, wherein the layer of semi-conductor material includes Gallium-Arsenic (GaAs).

5. A storage structure comprising:
    an array of magnetic locations, each magnetic location including
        a hard magnetic material sandwiched between a first and second layer of a spin-mirror material
        a layer of semi-conductor material;
        a layer of electrically conductive non-magnetic metal; and
    wherein the layer of electrically conductive non-magnetic metal is substantially thin to allow the photons emitted, during operation, by the layer of semi-conductor material to substantially pass through the conductive, non-magnetic metal.

6. A storage structure comprising:
    an array of magnetic locations, each magnetic location including a hard magnetic material sandwiched between a first and second layer of a spin-mirror material and a layer of semi-conductor material; and
    wherein the layer of hard magnetic material and the first and second layer of a spin-mirror material are substantially opaque to the photons emitted, during operation, by the layer of semi-conductor material.

* * * * *